(12) United States Patent
Iwade et al.

(10) Patent No.: US 9,023,736 B2
(45) Date of Patent: May 5, 2015

(54) SOLAR CELL MODULE MANUFACTURING APPARATUS AND SOLAR CELL MODULE MANUFACTURING METHOD

(75) Inventors: Takashi Iwade, Otsu (JP); Toyoharu Terada, Otsu (JP); Kazunori Nakakita, Otsu (JP)

(73) Assignee: Toray Engineering Co., Ltd., Tokyo (JP)

( * ) Notice: Subject to any disclaimer, the term of this patent is extended or adjusted under 35 U.S.C. 154(b) by 100 days.

(21) Appl. No.: 14/004,779

(22) PCT Filed: Feb. 13, 2012

(86) PCT No.: PCT/JP2012/053210
§ 371 (c)(1),
(2), (4) Date: Sep. 12, 2013

(87) PCT Pub. No.: WO2012/127932
PCT Pub. Date: Sep. 27, 2012

(65) Prior Publication Data
US 2014/0004650 A1    Jan. 2, 2014

(30) Foreign Application Priority Data

Mar. 18, 2011  (JP) ................. 2011-060661

(51) Int. Cl.
| | | |
|---|---|---|
| H01L 21/31 | (2006.01) | |
| H01L 31/18 | (2006.01) | |
| H01L 31/05 | (2014.01) | |
| B65G 47/26 | (2006.01) | |
| H01L 31/048 | (2014.01) | |

(52) U.S. Cl.
CPC ............... *H01L 31/18* (2013.01); *Y02E 10/50* (2013.01); *H01L 31/0504* (2013.01); *H01L 31/188* (2013.01); *B65G 47/261* (2013.01); *H01L 31/0488* (2013.01)

(58) Field of Classification Search
CPC . H01L 51/56; H01L 31/022441; H01L 31/18; H01L 51/42; H01L 51/448; H01L 21/56; H01L 31/0322; H01L 31/0487; H01L 31/0527; H01L 31/1804; H01L 31/1828; H01L 51/0021; H01L 51/0056; H01L 51/5234
USPC ................ 438/73; 257/E31.041; 136/244
See application file for complete search history.

(56) References Cited

FOREIGN PATENT DOCUMENTS

| | | |
|---|---|---|
| JP | 60-143676 A | 7/1985 |
| JP | 05-029640 A | 2/1993 |
| JP | 2009-010355 A | 1/2009 |
| JP | 2009-130193 A | 6/2009 |
| WO | 2010/023264 A2 | 3/2010 |

OTHER PUBLICATIONS

International Search Report of corresponding International Application No. PCT/JP2012/053210, dated on Mar. 27, 2012.

*Primary Examiner* — Mark A Laurenzi
(74) *Attorney, Agent, or Firm* — Global IP Counselors, LLP

(57) ABSTRACT

A solar cell module manufacturing apparatus includes a stage, a holding member, a moving mechanism, and a pushing member. The stage suctions a plurality of elongated solar cells that is arranged to form a solar cell module. The holding member releasably holds a portion of a solar cell to be placed on the stage. The moving mechanism moves the holding member forward and backward with respect to the stage. The moving mechanism moves the holding member backward in a state that an end portion in a front side of the cell held by the holding member that has been moved forward is suctioned on the stage, and then the portion of the cell is released by the holding member. The pushing member moves over the cell such that the pushing member pushes a lift portion of the cell down to the stage while the holding member moves backward.

5 Claims, 7 Drawing Sheets

SOLAR CELL MODULE MANUFACTURING APPARATUS AND SOLAR CELL MODULE MANUFACTURING METHOD

CROSS-REFERENCE TO RELATED APPLICATIONS

This application is a U.S. National stage of International Application No. PCT/JP2012/053210 filed on Feb. 13, 2012. This application claims priority to Japanese Patent Application No. 2011-060661 filed with Japan Patent Office on Mar. 18, 2011. The entire disclosure of Japanese Patent Application No. 2011-060661 is hereby incorporated herein by reference.

BACKGROUND

1. Field of the Invention

The present invention relates to a manufacturing apparatus for manufacturing a solar cell module in which plural numbers of solar cells are arranged side by side, and a method for manufacturing thereof.

2. Background Information

As a solar cell module, a slatted structure that plural numbers of elongated solar cells are arranged and connected side by side is well known (see PCT International Publication No. WO2010/023264 (Patent Document 1), for example), and for example, the solar cell module is manufactured as follows.

After various types of film-forming are performed for a photoelectric conversion on a band-shaped metal material, the elongated solar cells are obtained by cutting it in a predetermined length. And, the plural numbers of the cells are arranged on a stage by overlapping edge portions in the longer side of the cells, which are adjacent to each other, and the overlapped edge portions are bonded so as to become a single solar cell module. The solar cell module manufactured in the above described way provides the state that the plural numbers of the cells are electrically connected in series so that a voltage can be generated for a practical use.

As an apparatus that the edge portions in a longer side of the plural numbers of cells are overlapped and arranged on the stage, as shown in FIG. 7, a suction head 84 to suction a top surface of a cell 81 is provided, and the suction head 84 can move in an array direction of cells 81 on a stage 83 (horizontal direction in FIG. 7).

In the apparatus, the conveyance operations are performed by the suction head 84 in order of processes of suctioning of the cell 81, lifting F1 of the cell 81, horizontal movement F2 of the cell 81, bringing down F3 of the cell 81, and releasing of the suction of the cell 81. The cell 81 that has been suctioned can be mounted on the edge portion 82 of the cell 81 that has been previously placed. And, returning the head 84, the conveyance operations are repeated so that the cells 81 are arranged one by one on the stage 83.

SUMMARY

The cells 81 for a solar cell module with the slatted structure are an elongated member. In a case that the cell 81 has been warped or twisted, even when the cell 81 is conveyed by the suction head 84 and mounted on top of the edge portion 82 of the cell 81 that has been previously placed on the stage 83, it can cause that the upper cell 81 is in the state of partially lifting from the edge portion 82 of the lower cell 81. In this case, the edge portions 82, 82 of the cells 81, 81 that are adjacent to each other are bonded by, for example, a solder, or the like, but the cells 81, 81 can not be sufficiently bonded while the cell 81 is in the state partially lifting.

Thus, the object of the present invention is to provide a manufacturing apparatus of a solar cell module and a method for manufacturing thereof to prevent solar cells from leaving in the state of lifting when plural numbers of the cells are arranged such that edge portions thereof are overlapped each other.

A manufacturing apparatus of a solar cell module arranging and placing plural numbers of elongated solar cells so as to vertically overlap edge portions in longer sides of the cells with each other, and having a stage suctioning the cells, the manufacturing apparatus of the solar cell module of the present invention includes: a holding member that enables to hold a portion of a solar cell to be placed on the stage and enables to release the holding; a moving means that moves the holding member forward and backward on the stage in a longer direction of the cells as a moving direction, the moving means moving the holding member backward in a state that an end portion in a front side of the cell held by the holding member that is moved forward is suctioned on the stage, and then the holding of the cell by the holding member is released; and a pushing member that moves over the cell, which will be suctioned to the stage, and pushes a lift portion of the cell down to the stage when the holding member is moved backward.

A method for manufacturing a solar cell module arranging and placing plural numbers of elongated solar cells on a top surface of a stage so as to vertically overlap edge portions in longer sides of the cells with each other, and the manufacturing method of the present invention performed by the above mentioned manufacturing apparatus includes: a forward movement process that moves a holding member, which holds a portion of a solar cell to be placed on the stage, forward to a predetermined position on the stage in a longer direction of the cells as a moving direction; and a backward movement process that moves the holding member backward from the predetermined position in a state that an end portion in a front side of the cell held by the holding member, which is moved forward to the predetermined position, is suctioned on the stage, and then the holding of the cell by the holding member is released so that the cell is placed and suctioned on the stage from the end portion in the front side of the cell; wherein in the backward movement process, a pushing member moves over the cell, which will be suctioned on the stage, so as to push a lift portion of the cell down.

According to the manufacturing apparatus and the manufacturing method of the present invention, the end portion in the front side of the cells held by the holding member that is moved forward is suctioned on the stage, and in the state that the holding member releases to hold the cells, the holding member moves backward so that the cells are suctioned and arranged on the stage from the end portion in the front side of the cells. Also, in this case, the pushing member moves over the cells that will be suctioned on the stage, and pushes a lift portion of the cells down. Thus, the lifting of the cells can be resolved. For these reasons, on the stage, for example, even if a portion of the cells is lifted by warping or twisting the cells, it is possible the cells to be suctioned on the stage as in the flat state. That is, it prevents the cells (a portion of cells) from leaving in the state of lifting on the stage.

Since the front surface of the solar cells forms an electric power generation layer that performs a photoelectric conversion, it is preferable not to make scratches on its front surface. Therefore, it is preferable to have a configuration that the holding member has a suction part so as to suction a back surface of the cell.

Also, it is preferable that a plurality of suction holes suctioning a back surface of the cell so as to suction the cell is provided in the stage such that the suction holes are arranged in a forward and backward direction of the holding member. It is preferable to have a sheet member that sequentially covers and closes the suction holes arranged in the forward direction when the holding member moves forward, and is removed from the closed suction holes when the holding member moves backward.

In such case, when the holding member moves forward, the suction holes of the stage are closed by the sheet member, and also, when the holding member moves backward, the sheet member is removed from the suction holes. Instead of the removed sheet member, the suction holes are covered by the cells to be arranged on the stage. Therefore, in the operations that the cells are moved in the longer direction to be arranged on the stage, it can prevent the suction holes from leaving in the state of opening.

According to the present invention, it enables that the cells are suctioned on the stage in a flat state, and the cells can be prevented from leaving in the state of lifting on the stage.

DETAILED DESCRIPTION OF EMBODIMENTS

Hereinafter, the preferred embodiment of the present invention will be described in reference to the drawings.

FIGS. 1(a) to 1(c) and FIGS. 2(a) to 2(c) are side views showing a schematic configuration of a manufacturing apparatus 1 of the present invention and its operations.

Figure 1:
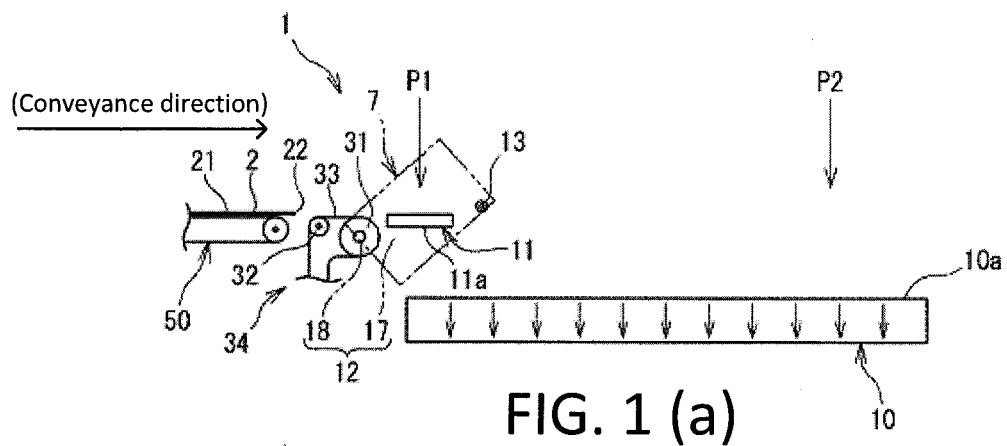
FIGS. 1(a), 1(b) and 1(c) are side views showing a schematic configuration of a manufacturing apparatus of the present invention and its operations.
Figure 1:
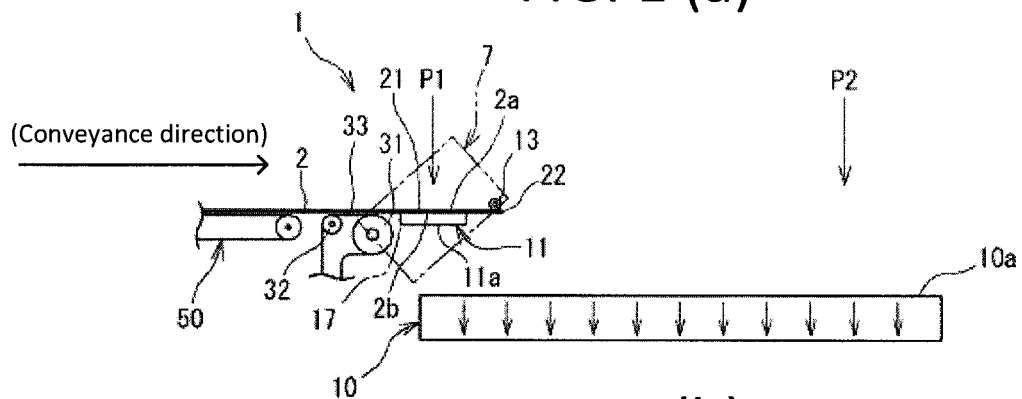
Figure 1:
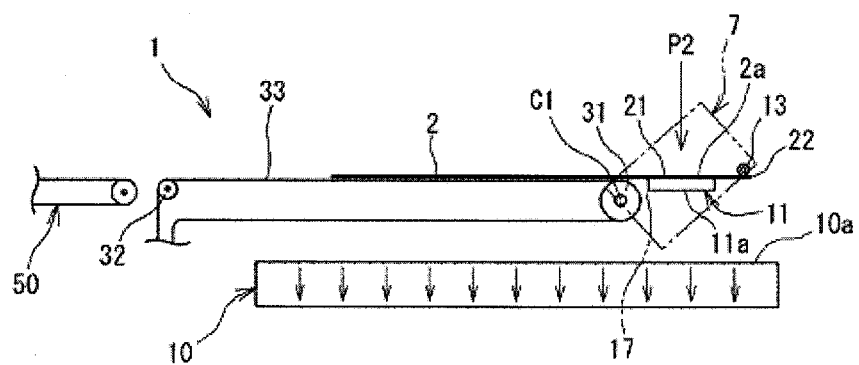
Figure 2:
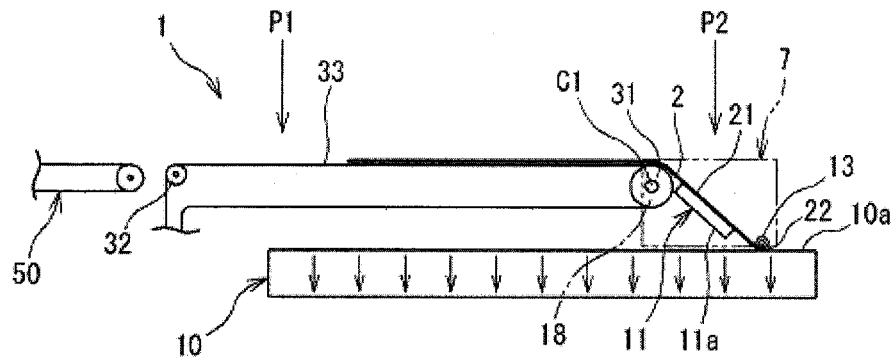
FIGS. 2(a), 2(b) and 2(c) are side views showing the schematic configuration of the manufacturing apparatus of the present invention and its operations.
Figure 2:
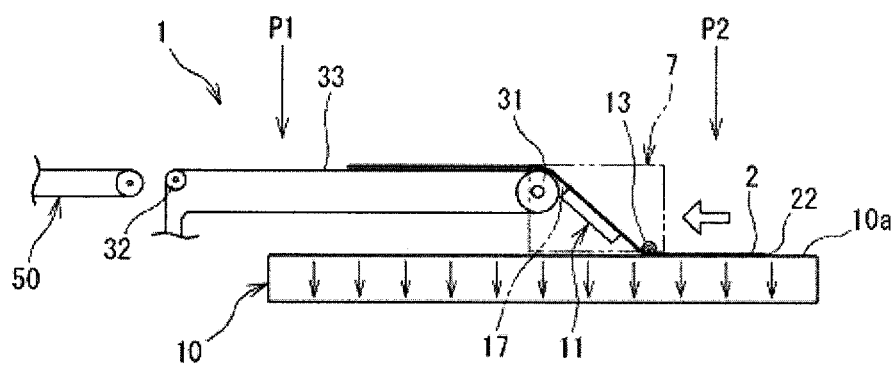
Figure 2:
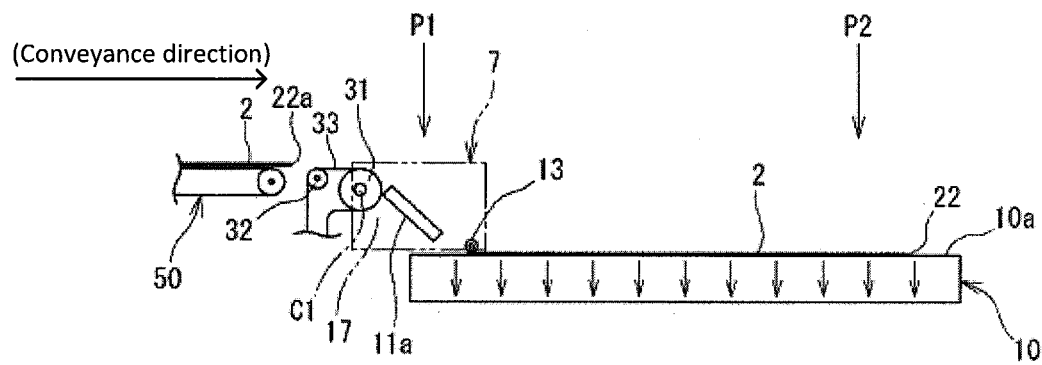
Figure 3:
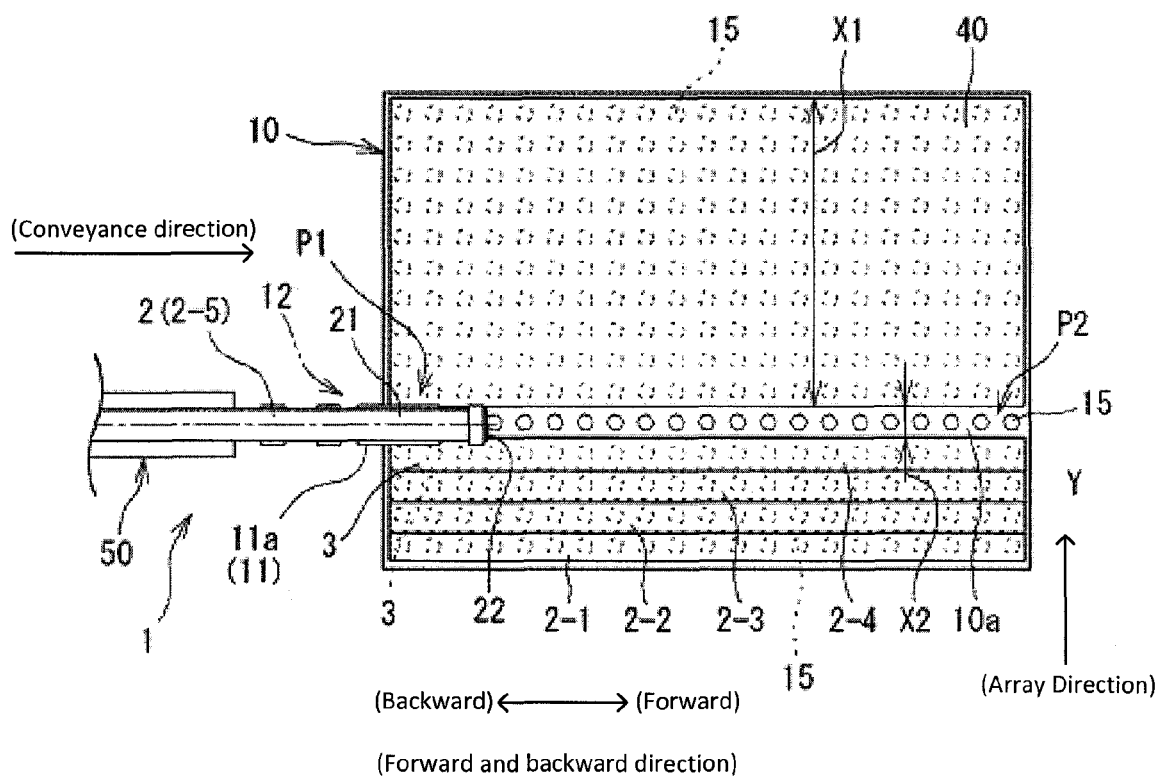
FIG. 3 is a plane view showing the schematic configuration of the manufacturing apparatus of the present invention.
Figure 5:
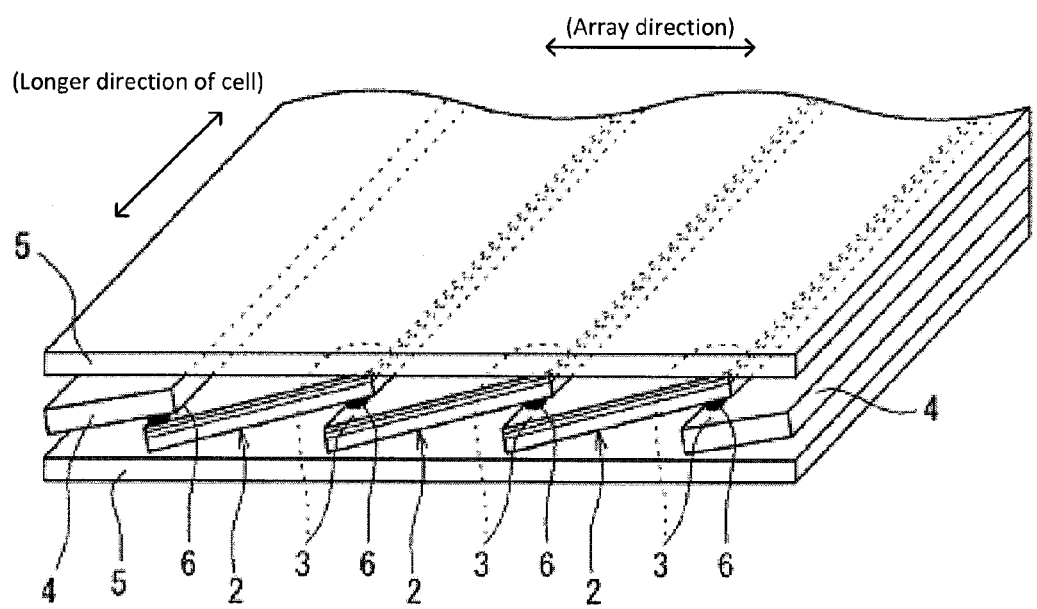
FIG. 5 is an explanatory diagram of a solar cell module.

FIG. 3 is a plane view of the manufacturing apparatus 1. As shown in FIG. 5, the solar cell module manufactured by the manufacturing system (manufacturing line) that includes the manufacturing apparatus 1 (hereinafter referred to as "module") has plural numbers of elongated cells for solar cells 2 (solar cells), and an electrode 4 is provided in both side of the plurality of cells 2. The cells 2 are a rectangle shape, and the longer direction of the cells 2 and the array direction of the cells 2 in which the cells 2 are arranged are intersected. By the way, in FIG. 5, in order to make a description easy, it shows only three cells 2, but the actual module includes more than three cells 2.

These cells 2 and the electrodes 4 are sandwiched by cover members 5 from the both sides, and the module forms a sheet-shape as one. The cover members 5 are made of a film-shaped resin material that has flexibility and transmits sunlight, and the cover members 5 are adhered to the front surface and the back surface of the cells 2 and the electrodes 4. By the way, FIG. 5 shows a condition that the cover members 5 are separated from the cells 2.

The edge portions 3, 3 of the cells 2, 2 that are adjacent to each other in the array direction are placed in the state vertically overlapping through a joint metal so that the cells 2, 2 are electrically and structurally connected in the overlapped edge portions 3, 3 by the joint metal. The joint metal is made of, for example, solder 6, and the solder 6 is provided to be dotted along the edge portion 3 of the cell 2 and along the longer direction of the cell 2.

In order to manufacture such module, first, after performing various types of film-forming for the photoelectric conversion on the band-shaped metal material, the plural numbers of elongated cells 2 are obtained by cutting it in a predetermined length. And, on the stage, these cells 2 are arranged in the array direction in order such that the edge portions 3, 3 in the longer side of the adjacent cells 2, 2 are overlapped with each other. It becomes one solar cell module by connecting these edge portions 3, 3 each other.

Further, the manufacturing apparatus 1 of the present invention can sequentially arrange the cells 2 in the array direction by vertically overlapping the edge portions 3, 3 in the longer side of the adjacent cells 2, 2 with each other on the stage 10.

In the upper stream side of the manufacturing apparatus 1 (left side in FIGS. 1(a) to 1(c), FIGS. 2(a) to 2(c) and FIG. 3), a conveyance apparatus 50 is provided to convey the elongated cells 2, which has been produced in the predetermined length, in the longer direction thereof as the conveyance direction. For example, the conveyance apparatus 50 is provided with a belt conveyor to convey the cells 2. The conveyance apparatus 50 conveys the cells 2 to be arranged on the stage 10 to the stage 10 side, and a portion (a portion 21 of the cell 2) of the front side (lead side) in the conveyance direction is positioned in a standby position P1 that is set in an edge part of the stage 10 (see FIG. 1(b)). Further, the operations that the cells 2 are arranged one by one on the stage 10 by the manufacturing apparatus 1 are performed. By the way, FIG. 3 shows in the state that the four cells 2-1 to 2-4 have already been arranged on the stage 10, and it indicates in the state prior to the arrangement of the fifth cell 2-5 on the stage 10.

In FIGS. 1(a) to 1(c) and FIG. 3, the manufacturing apparatus 1 has the stage 10, a holding member 11 that enables to hold the portion 21 of the cells 2 to be arranged on the stage 10 and enables to release the hold, a moving means 12 that moves the holding member 11 forward and backward between the standby position P1 and the predetermined position P2 on the stage 10 in the longer direction of the cells 2 as the moving direction, and a pushing member 13 that moves backward with the holding member 11 when the holding member 11 is moved backward from the predetermined position P2 to the standby position P1 by the moving means 12. By the way, the conveyance direction of the cells 2 by the conveyance apparatus 50 and the forward movement direction to the predetermined position P2 of the holding member 11 by the moving means are corresponded.

In FIG. 3, in the state that the longer sides of the edge portions 3, 3 of the cells 2, 2, which are adjacent to each other in the array direction, are vertically overlapped, the plural numbers of cells 2 are arranged on the stage 10, and the plural numbers of cells 2 can be suctioned on the stage 10.

To suction the cells 2, a plurality of suction holes 15 is provided in the stage 10 to suction the back surface of the cells 2. The plurality of suction holes 15 is formed in line along the forward and backward movement direction of the holding member 11, and in addition, the plurality of lines is provided in the array direction of the cells 2. The suction holes 15 are provided in the entire region of the stage 10 where the cells 2 are arranged and they are connected to a pump (not shown in the drawings) that performs to suction (air) so that it performs to suction the entire region simultaneously. Accordingly, the stage 10 can restrict the cells 2 that have already been arranged and the cells 2 that will be arranged on the top surface 10a of the stage 10 by the suction.

Further, the stage 10 can move one pitch, which is equivalent to the dimension in the short direction of the cells 2, in the array direction every time one cell 2 is arranged.

The holding member 11 has a suction plate 11a as a suction part that suctions and holds the portion 21 of the cell 2, and a pump (not shown in the drawings) is connected to the suction plate 11a to perform suctioning (air). When the pump performs suctioning, the suction plate 11a can suction and hold the portion 21 of the cell 2, and when the suction plate 11a stops suctioning, the suction of the portion 21 of the cell 2 is released. By the way, in the present embodiment, within the cell 2, a portion (the above described portion 21) suctioned by the suction plate 11a is a portion close to the end portion 22 that is the front side of the cell 2 to be arranged on the stage 10.

Also, in the front surface 2a (top surface in FIG. 1(b)) of the cell 2, an electric power generation layer that performs the photoelectric conversion is formed so that it is preferable to avoid scratching the front surface 2a. Thus, the suction plate 11a suctions the back surface 2b (bottom surface in FIG. 1(b)) of the portion 21 of the cell 2.

The suction plate 11a is equipped with the head 7 that is provided with the manufacturing apparatus 1.

The moving means 12 has a forward and backward movement mechanism 17 that moves the head 7 forward and backward between the standby position P1, which is close to the conveyance apparatus 50, and the predetermined position P2 on the stage 10, and a swing mechanism 18 in which the head 7 is swung to turn around a horizontal line so as to change an angle of the head 7.

The forward and backward movement mechanism 17 has an expansion and contraction actuator (not shown in the drawings). When the expansion and contraction actuator is expanded, the head 7 is positioned in the predetermined position P2, and when the expansion and contraction actuator is contracted, the head 7 is positioned in the standby position P1.

The swing mechanism 18 has a motor equipped with a decelerator that is provided in the front edge of the expansion and contraction actuator (not shown in the drawings), and the head 7 is fixed in output axis of the motor. When the output axis of the motor is rotated to a predetermined angle in one direction, as shown in FIG. 1(c) and FIG. 2(a), the head 7 is swung downwardly by turning around the horizontal line C1 (axis of pulley 31) as a center in the predetermined position P2. In the state that the head 7 has been swung downwardly, when the expansion and contraction actuator of the forward and backward mechanism 17 is contracted, the head 7 moves backward to the standby position P1 side along the stage 10 (see FIG. 2(b) to FIG. 2(c)). And, when the output axis of the motor is rotated to the predetermined angle in another direction, the head 7 is swung upwardly by turning around the horizontal line C1 (the axis of the pulley 31) as a center in the standby position P1 so that it can return to the state shown in FIG. 1(a).

By the way, the cell 2 is made by various types of film forming on a thin metal sheet so as to have flexibility. Because of this, when the swing mechanism 18 swings the head 7 downwardly in the state that the suction plate 11a suctions to hold the portion 21 of the cell 2, as shown in FIG. 2(a), the cell 2 can be bent in the first pulley 31 that will be described later, and it becomes in the state that the portion 21 of the cell 2 is declined toward the stage 10. And, the end portion 22 of the front side of the cell 2 that has been declined is placed on the top surface 10a of the stage 10, and in this state, it is thus suctioned and held on the stage 10.

The first pulley 31 is equipped in the head 7, and the second pulley 32 is provided between the pulley 31 and the conveyance apparatus 50 so that a belt 33 is applied between these pulleys 31, 32. The second pulley 32 that does not move is a fixed pulley and on the other hand, the first pulley 31 is a movable pulley that moves forward and backward with the suction plate 11a because the first pulley 31 is equipped with the head 7. Therefore, the distance between the pulleys 31, 32 is changed so that an adjustment mechanism 34 to change the length of the belt 33 between the pulleys 31, 32 is provided. The adjustment mechanism 34 will be described later.

The cell 2 can be placed on the belt 33 between the pulleys 31, 32, so that the cell 2, which is suctioned and held on the suction plate 11a and is conveyed to the predetermined position P2 by the forward and backward movement mechanism 17, can be supported from behind.

Figure 4:
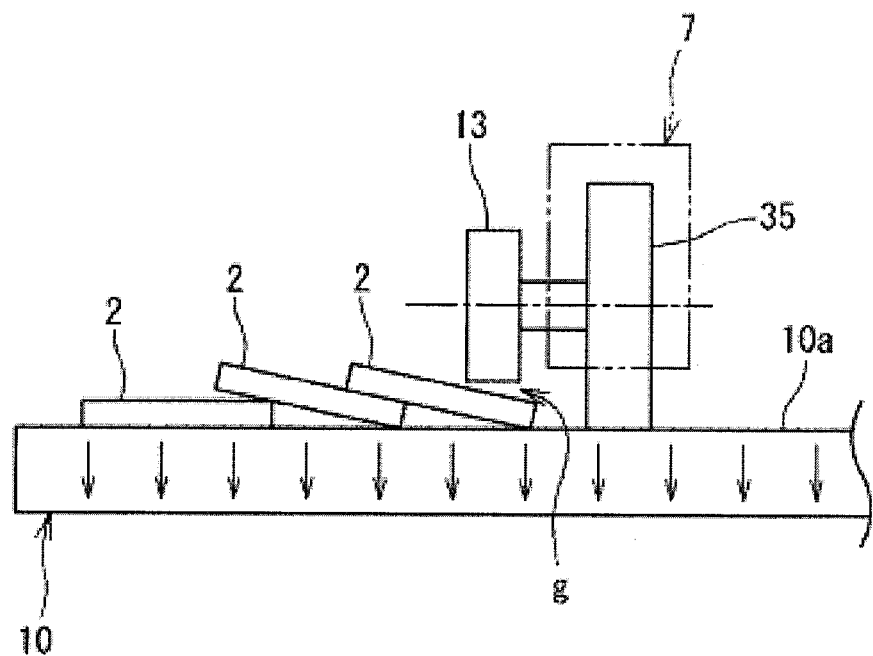
FIG. 4 is an explanatory diagram of a pushing member and a head as viewed in a forward and backward movement direction in a state that the head is swung downwardly.

The pushing member 13 is equipped in the head 7 and moves forward and backward with the suction plate 11a. The pushing member 13 is a roller, and at least its circumference part is preferably composed of a soft material such as sponge, or the like. FIG. 4 is an explanatory diagram of the pushing member 13, and is an illustration viewing the head 7 in the forward and backward movement direction in the state that the head 7 is swung downwardly by the swing mechanism 18. A guide roller 35 that rolls on the stage 10 is provided in the head 7, and the radius of the guide roller 35 is larger than the pushing member (pushing roller) 13. Also, the rotation center of the guide roller 35 and the rotation center of the pushing member (pushing roller) 13 are corresponded.

Further, in the state that the head 7 is swung downwardly, when the guide roller 35 is contacted to the top surface 10a of the stage 10, a slight gap g is formed between the pushing member 13 and the top surface of the cell 2 that is placed on the stage 10 in ideal conditions (planar). That is, the radius of the guide roller 35 is set by summing the radius of the pushing member 13, the thickness of the cell 2, and the gap g.

Accordingly, as shown in FIGS. 2(a) to 2(c), in the state that the head 7 is swung downwardly, the contracting operation is performed in the expansion and contraction actuator of the forward and backward movement mechanism 17. When the head 7 moves backward along the stage 10 from the predetermined position P2 to the standby position P1 side, the guide roller 35 moves on the stage 10 by the rotation. In this case, the guide roller 35 maintains the pushing member (pushing roller) 13 in a position of a certain height. That is, the pushing member 13 can run on the cells 2 that will be suctioned on the stage 10.

According to the pushing member 13, even if the portion of the cell 2 suctioned on the stage 10 is likely to be lifted upwardly, when the head 7 moves backward, the pushing member 13 moves over the cell 2 and contacts to the lift portion of the cell 2 so that the lift portion can be pushed down to the stage 10 side.

A manufacturing method for arranging and placing the plural numbers of elongated cells 2 in sequence on the top surface 10a of the stage 10 so as to vertically overlap the edge portions of the longer side thereof with each other, and the manufacturing method performed by the manufacturing apparatus 1 equipped with the above configurations will be described in reference to FIGS. 1(a) to 1(c) and FIGS. 2(a) to 2(c).

As shown in FIG. 1(a) and FIG. 1(b), the cell 2, which is cut in the predetermined length, to be placed on the stage 10 is conveyed to the head 7 side by the conveyance apparatus 50, and this cell 2 is conveyed to the position where the portion 21 that is close to the end portion 22 of the front side in the conveyance direction is placed on the suction plate 11a. The suction plate 11a is located in the standby position P1, and this suction plate 11a suctions and holds the portion 21 of the cell 2 (e.g., the preparation processes).

The forward and backward movement mechanism 17 moves the head 7 forward to the predetermined position P2 on the stage 10. In this way, the suction plate 11a that suctions and holds the portion 21 of the cell 2 is forwarded from the standby position P1 to the predetermined position P2 on the stage 10 through the region above the stage 10 in the longer direction of the cell 2 as the moving direction as shown in FIG. 1(c). And, in the predetermined position P2, as shown in FIG. 2(a), the head 7 is swung downwardly by the swing mechanism 18 (e.g., the forward movement processes). Therefore, it becomes a state that the end portion 22 of the front side of the cell 2 is placed on the top surface 10a of the stage 10.

Suctioning by the stage 10 continues until all of the cells 2 are placed on the stage 10, and the edge portions of these cells 2 are bonded each other. Because of this, the end portion 22 of the front side of the cell 2 that is held by the suction plate 11a forwarded to the predetermined position P2 is suctioned on the stage 10. And, the end portion 22 is suctioned, and then, it becomes the state that the portion 21 of the cell 2 held by the suction plate 11a is released. After that, in the state of releasing, as shown in FIG. 2(b) and FIG. 2(c), the head 7 (suction plate 11a) is moved backward from the predetermined position P2 by the forward and backward movement mechanism 17 (e.g., the backward movement processes). According to the backward movement processes, by moving the head 7 backwardly, in a case of the end portion 22 of its front side as a starting point, the cells 2 can be placed and suctioned on the stage 10 in sequence along the longer direction on the stage 10 (see FIG. 2(c)).

Further, in the backward movement processes, by moving the head 7 backwardly, the pushing member 13 is moved backward with a cell 2 that is not suctioned by the suction plate 11a as shown in FIG. 4 and the pushing member 13 moves over the cells 2 that are suctioned in sequence on the stage 10 along the longer direction. In this case, among the cells 2 suctioned on the stage 10, if there is a portion lifted by warping or twisting the cells 2 (lift portion), the pushing member 13 contacts to the top surface of the lift portion so as to push the lift portion down to the stage 10 side.

Because of this, even when a portion of the cells 2 that will be placed on the stage 10 is likely to be lifted, it enables the cells 2 to be suctioned on the stage 10 in the flat state, and a later process, in which the edge portions 3, 3 of the cells are bonded each other (for example, it is bonded by solder), can be reliably performed.

Then, when one of the cells 2 is placed on the stage 10 and is held by suctioning, in the present embodiment, the stage 10 moves one pitch, which is equivalent to a dimension in the short direction of one cell 2, in the array direction (in a direction of arrow Y in FIG. 3), and the next cell 2 is placed on the stage 10 by the above described respective processes and is held by suctioning. After that, the above mentioned respective processes are repeated so that the plural numbers of cells 2 are precisely arranged in a pitch evenly on the stage 10.

Figure 7:
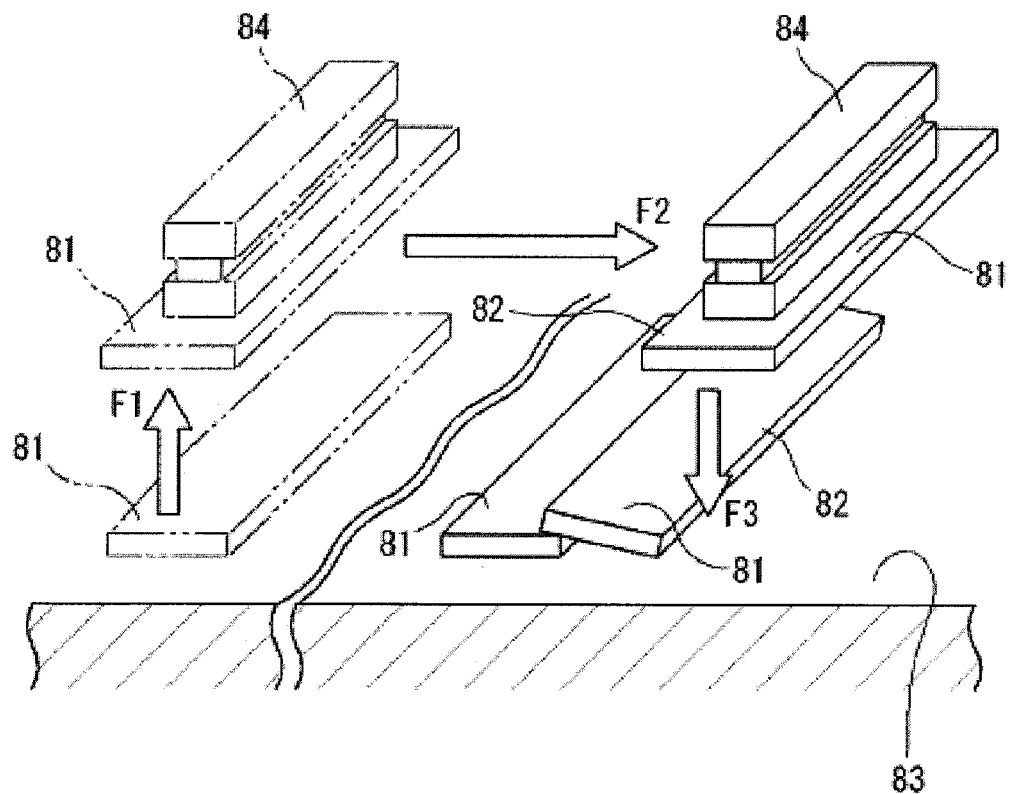
FIG. 7 is an explanatory diagram of a conventional manufacturing apparatus.

Further, according to the manufacturing apparatus of the present embodiment, when it is compared with the conventional apparatus (FIG. 7), it enables to reduce the cycle time for arranging the cells 2 on the stage 10. That is, in the conventional example of FIG. 7, the operations in order of suctioning of the cell 81, lifting F1 of the cell 81, horizontal movement F2 of the cell 81, bringing down F3 of the cell 81, and releasing of the suction of the cell 81 are performed, but a stop time is required between the respective operations so that a lot of time are wasted in total. However, in the manufacturing apparatus of the present embodiment, each part can be operated sequentially, and therefore, the wasted stop time is omitted. Specifically, in the drawings from FIG. 1(c) to FIG. 2(a), the forward and backward movement mechanism 17 and the swing mechanism 18 are operated in the same time period, and it is preferable to set the operation timing to start swinging the head 7 downwardly before reaching the head 7 to the predetermined position P2.

In addition, in the conventional apparatus, the suction head 84 suctions the top surface (film-forming surface of electric power generation layer) of the cell 81 so that it can cause to scratch the electric power generation layer. However, in the present embodiment, the surface suctioned by the suction plate 11a to convey the cell 2 is the bottom surface side of the cell 2 so that it can be prevented from such scratches.

Furthermore, in the manufacturing apparatus 1 of the present embodiment, as shown in FIG. 3, the plurality of suction holes 15 is widely formed in planer view on the stage 10, and the suction in each suction hole 15 continues until all of the cells 2 are bonded. Thus, in a region of the stage 10 where the cells 2 are not placed (i.e., the region X1 in FIG. 3), it is preferable that the suction holes 15 are covered so that a sheet-shaped cover member 40 is provided in the region X1. The cover member 40 is shifted one row by one row every time one cell 2 is placed on the stage 10, and in the region where the cover member 40 has been removed, the next cell 2 is placed.

By the way, FIG. 3 shows one cover member 40 and indicates a configuration to cover the suction holes 15 in X1 region entirely. However, the cover member 40 covering one row of the suction holes 15 along the forward and backward direction can be provided with plural numbers in the array direction, and when the cell 2 is placed on the stage 10, each cover member can be removed one row by one row.

Within the region on the stage 10, the suction holes 15 in the region (region X2 in FIG. 3) where new cells 2 are placed are covered by another sheet member.

Figure 6:
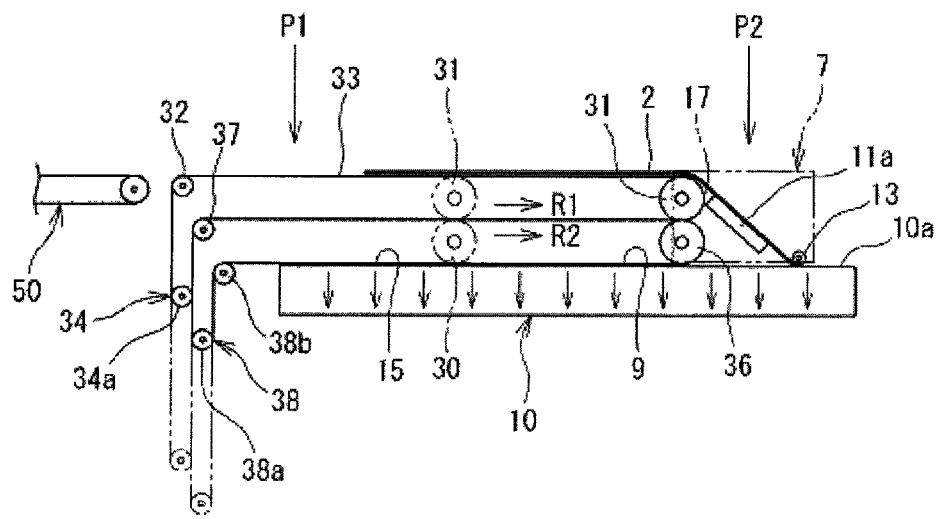
FIG. 6(a) is an explanatory diagram of a sheet member and an adjustment mechanism.
FIG. 6(b) is a plane view of a stage.
Figure 6:
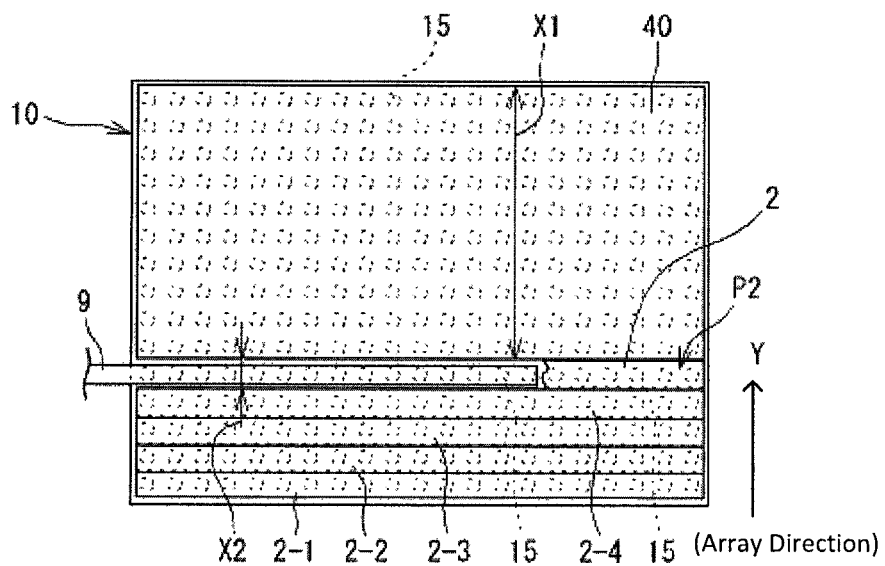

That is, as shown in FIG. 6(a), the third pulley 36 is equipped in the head 7, and also, the fourth pulley 37 is provided near the second pulley 32 so that a belt-shaped sheet member 9 is applied between the pulleys 36, 37. Since a distance between the pulleys 36, 37 is changed, an adjustment mechanism 38 that changes a length of the sheet member 9 between the pulleys 36, 37 is provided.

The third pulley 36 is equipped in the head 7 so that in the forward movement process that moves the head 7 forward to the predetermined position P2 by the forward and backward movement mechanism 17, it is driven from the standby position P1 side to the predetermined position P2 side and adjacent to the top surface 10a of the stage 10. Because of this, in a case of the forward movement process, the suction holes 15 arranged in the forward movement direction can be covered by the sheet member 9 in sequence.

And, following the forward movement process, when the backward movement process is executed, the third pulley 36 is driven from the predetermined position P2 side to the standby position P1 side and adjacent to the top surface 10a of the stage 10. Because of this, as shown in FIG. 6(b), the sheet member 9 covered in the forward movement process is removed from the suction holes 15, and instead of that, the cells 2 to be placed on the stage 10 are going to cover the suction holes 15. Therefore, in the region X2 shown in FIG.

6(b), it can prevent the suction holes 15 from remaining as the opening state when the operations to place the cells 2 on the stage 10 are performed.

For example, when the above mentioned sheet-shaped cover member 40 and the above mentioned sheet member 9 do not cover the suction holes 15 of the stage 10, that is, when these suction holes 15 remain the open state, the suction performed by these suction holes 15 is wasted so that the suction power in the suction holes 15 for the cells 2 (cells 2-1 to 2-4); which have already been placed on the stage 10, becomes weak. However, the above mentioned cover member 40 and the above mentioned sheet member 9 can prevent the suction power from lowering in the entire stage 10 and it can ensure the suction power in the suction holes 15 on which the cells 2 are placed. Therefore, the cells 2 (cells 2-1 to 2-4) that have already been placed on the stage 10 are stably suctioned and held on the stage 10.

The above mentioned adjustment mechanisms 34, 38 will be described. In FIG. 6(a), the adjustment mechanism 34 of the present embodiment has a pulley 34a for adjustment that moves in the vertical direction. In the pulley 34a, the above mentioned belt 33 is applied through the second pulley 32, and the pulley 34a vertically moves with the forward and backward movement of the first pulley 31 so as to move to prevent the belt 33 from causing slack.

The adjustment mechanism 38 for sheet 9 also has the configuration in the same manner as the adjustment mechanism 34 for the belt 33, and has a pulley 38a for adjustment. And, the third pulley 36 vertically moves with the forward and backward movement so as to move to prevent the sheet 9 from causing slack.

In the present embodiment, the adjustment mechanism 38 for sheet 9 also has a turning pulley 38b, and the sheet 9 in the horizontal direction is turned to the vertical direction by the turning pulley 38b and the above mentioned fourth pulley 37.

Then, the adjustment mechanism 34 for the belt 33 turns the belt 33 in the horizontal direction to the vertical direction by the second pulley 32 and the fourth pulley 37. That is, the fourth pulley 37 for the sheet 9 is used for the belt 33 as well so as to simplify the member.

In the forward movement process, the moving direction of the belt 33 (bottom side) between the pulleys 31, 37 is the arrow R1 direction, and the moving direction of the sheet member 9 (upper side) between the pulleys 36, 37 is the arrow R2 direction. The belt 33 and the sheet member 9 that are adjacent to each other in the upper and lower position synchronously move to the same direction. In the backward movement process, the belt 33 and the sheet member 9 that are adjacent to each other in the upper and lower position synchronously move to the same direction (opposite direction of the arrows R1, R2). Therefore, it is possible to use the fourth pulley 37 for the dual-purpose.

The manufacturing apparatus of the present invention is not limited to the embodiment shown in the drawings so that it can be other embodiments within the scope of the present invention. For example, in the above mentioned embodiment, the forward and backward movement mechanism 17 was described as the expansion and contraction actuator, but it can be a configuration other than that, and also, the swing mechanism 18 can be other configurations. Further, the pushing member 13 was described in a state of providing the gap g between the pushing member 13 and the top surface of the cells 2 placed on the stage 10 ideally (in plane) when it moves backward with the suction plate 11a, but the pushing member 13 can be a roller in which at least a circumference part is composed of a soft material, and the above mentioned gap g can be omitted so that this roller can move along the top surface of the cells 2.

The invention claimed is:

1. A solar cell module manufacturing apparatus comprising:
    a stage configured to suction a plurality of elongated solar cells that is arranged to form a solar cell module such that edge portions in longer sides of each of adjacent pairs of the cells vertically overlap with each other;
    a holding member configured to releasably hold a portion of a solar cell to be placed on the stage;
    a moving mechanism configured to move the holding member forward and backward with respect to the stage in a movement direction of the holding member corresponding to a longer direction of the cell, the moving mechanism being further configured to move the holding member backward in a state that an end portion in a front side of the cell held by the holding member that has been moved forward is suctioned on the stage, and then the portion of the cell is released by the holding member; and
    a pushing member configured to move over the cell such that the pushing member pushes a lift portion of the cell down to the stage while the holding member moves backward.

2. The solar cell module manufacturing apparatus according to claim 1, wherein
    the holding member has a suction part that is configured to suction a back surface of the cell.

3. The solar cell module manufacturing apparatus according to claim 1, further comprising
    a sheet member removable with respect to the stage,
    the stage having a plurality of suction holes through which the stage is configured to suction a back surface of the cell, the suction holes being arranged in the movement direction of the holding member, and
    the sheet member being configured to sequentially cover the stage to close the suction holes arranged in the movement direction while the holding member moves forward, the sheet member being further configured to be removed from the suction holes that has been closed while the holding member moves backward.

4. A solar cell module manufacturing method for manufacturing a solar cell module having a plurality of elongated solar cells that is arranged such that edge portions in longer sides of each of adjacent pairs of the cells vertically overlap with each other, the solar cell module manufacturing method comprising:
    moving a holding member forward to a predetermined position with resect to a stage in a movement direction of the holding member corresponding to a longer direction of the cell while the holding member holds a portion of a solar cell to be placed on a top surface of the stage; and
    moving the holding member backward from the predetermined position in a state that an end portion in a front side of the cell held by the holding member that has been moved forward to the predetermined position is suctioned on the stage, and then the portion of the cell is released by the holding member, such that the cell is placed and suctioned on the stage from the end portion in the front side of the cell,
    the moving of the holding member backward further including a pushing member moving over the cell such that the pushing member pushes a lift portion of the cell down to the stage.

5. The solar cell module manufacturing apparatus according to claim 2, further comprising
a sheet member removable with respect to the stage,
the stage having a plurality of suction holes through which the stage is configured to suction a back surface of the cell, the suction holes being arranged in the movement direction of the holding member, and
the sheet member being configured to sequentially cover the stage to close the suction holes arranged in the movement direction while the holding member moves forward, the sheet member being further configured to be removed from the suction holes that has been closed while the holding member moves backward.

\* \* \* \* \*